United States Patent [19]
Deutschmann et al.

[11] 3,970,880
[45] July 20, 1976

[54] CRYSTAL MOUNTING STRUCTURE AND METHOD OF ASSEMBLY

[75] Inventors: William B. Deutschmann, Chicago; Corwin E. Livenick, Hickory Hills; Robert W. Paulsen, Arlington Heights; Len A. Tyler, Chicago; Clifford L. Rose, River Grove, all of Ill.

[73] Assignee: Motorola, Inc., Chicago, Ill.

[22] Filed: Aug. 5, 1974

[21] Appl. No.: 491,709

Related U.S. Application Data

[63] Continuation-in-part of Ser. No. 395,305, Sept. 7, 1973, abandoned.

[52] U.S. Cl.................................. 310/9.4; 310/9.1; 310/8.9
[51] Int. Cl.[2]........................................ H01L 41/04
[58] Field of Search........................ 310/8.9, 9.1, 9.4

[56] References Cited
UNITED STATES PATENTS

| | | | |
|---|---|---|---|
| 2,508,232 | 5/1950 | Dewey | 310/9.4 X |
| 3,046,423 | 7/1962 | Wolfskill et al. | 310/9.1 |
| 3,173,035 | 3/1965 | Fisher | 310/9.1 |
| 3,643,305 | 2/1972 | Furnival | 310/9.4 X |
| 3,828,210 | 8/1974 | Livenick | 310/9.1 |
| 3,849,681 | 11/1974 | Scott, Jr. et al. | 310/9.4 X |

Primary Examiner—Mark O. Budd
Attorney, Agent, or Firm—James W. Gillman; Eugene A. Parsons

[57] ABSTRACT

A crystal mounting structure for mounting a crystal plate having a plurality of electrodes on major surfaces thereof assembled by means of a rectangular conductive lead frame having a plurality of inwardly extending mounting members and a frame of insulating material defining a central aperture formed with the mounting members embedded therein for rigid support of the crystal plate and electrical connection thereto. A number of rigid conductive mounting members extend through the insulating material and have first portions extending into the central aperture. A number of conductive mounting members hold the mounting structure to the lead frame for later testing purposes. Two of the first portions of the mounting members extending into the central cavity extend inwardly from substantially opposite directions. The crystal plate electrodes are electrically and mechanically secured to the first portions of the mounting members in the central aperture by means of a relatively plastic solder or the like. The first portions are rigid for reducing flexure of the first portions and the crystal plate. Top and bottom covers are secured to the frame, for providing a sealed enclosure, and to a mounting member for providing a grounded RF shield.

15 Claims, 6 Drawing Figures

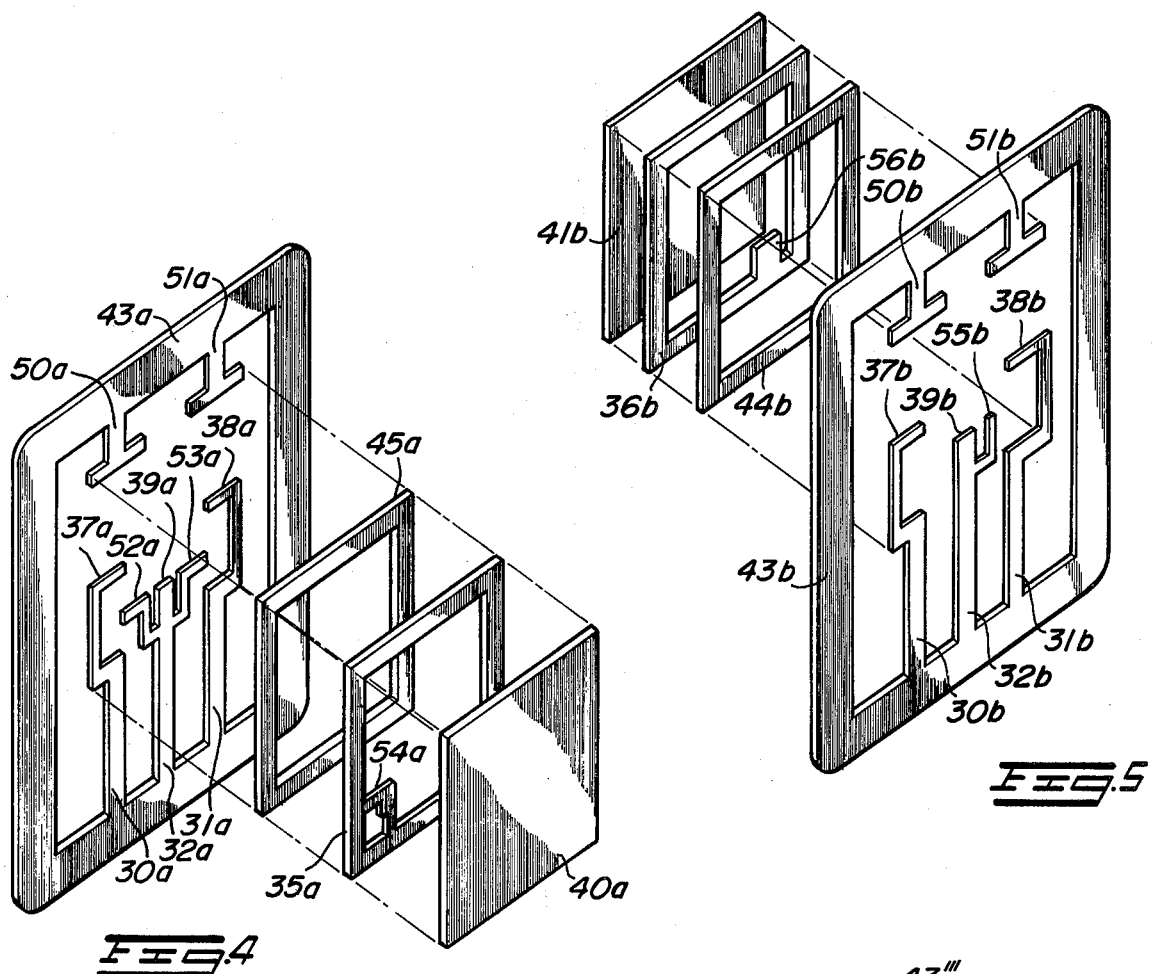
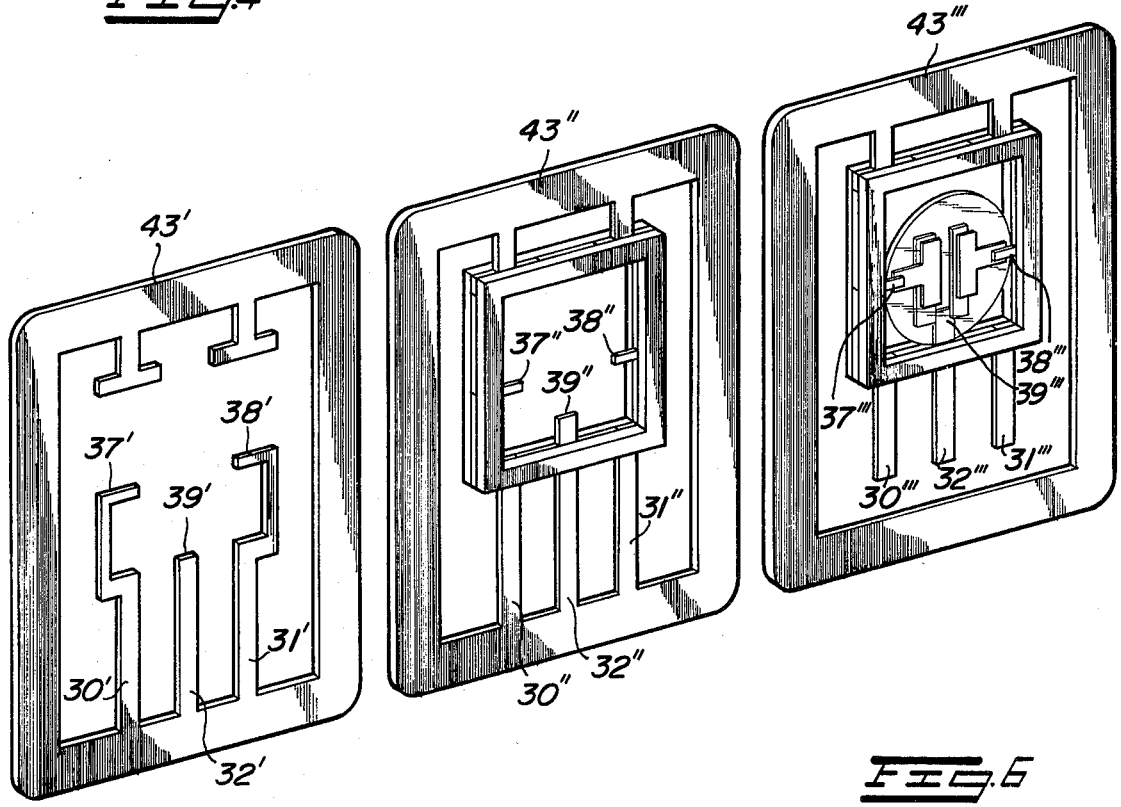

CRYSTAL MOUNTING STRUCTURE AND METHOD OF ASSEMBLY

CROSS REFERENCE TO RELATED APPLICATIONS

This application is a continuation in part of copending application Ser. No. 395,305, filed Sept. 7, 1973, entitled, "Crystal Mounting Structure", having the same inventors and assignee, and now abandoned.

BACKGROUND

Quartz crystal resonators and filters used in electronic circuits are positioned within a mounting structure which provides both an electrical connection to and mechanical support for the crystal plate. The mounting used is a factor in determining the mechanical reliability of the crystal unit when subjected to shock or vibration. Prior art mounting structures generally are of the type shown and described in U.S. Pat. No. 3,336,487, issued to L. G. Martyn, et al, and assigned to the same assignee as this application. In the Martyn patent, a crystal plate is supported on a mounting base through which conducting pins extend for making electrical connections to the electrodes. Resilient wires secure the conducting pins to the crystal. These resilient wires extend upwards on both sides of the crystal plate from the base. A cover is secured to the mounting base and forms an enclosure for the crystal plate. It is necessary to have flexible supports to prevent any appreciable stress being applied to the crystal plate due to the differential expansion of the mounting base and crystal plate with changing temperature. Should the crystal unit be dropped, the resilient wires supporting the crystal plate will deflect upon impact and may cause fracture of the plate due to its bending or striking the cover.

When a crystal plate is mounted in the structure such as described above, it is then tested to determine whether it is operating at the correct frequency. If it is not operating at the correct frequency, the thickness of the electrodes is adjusted until the crystal operates at the correct frequency. In order to perform this adjustment procedure, both sides of the crystal must be exposed, after it is mounted in the desired mounting structure. The structure described above allows such testing and operating frequency corrections. However, in order to provide this capability, the cover which is secured to the mounting base to form the enclosure for the crystal plate, is made quite large making the entire crystal unit quite bulky.

Further, in all prior art assembly techniques, crystal unit packages must be assembled and tested one at a time. This greatly increases the labor and the cost of the final package.

SUMMARY

It is therefore an object of this invention to provide an improved mounting structure for a quartz crystal plate.

Another object of this invention is to provide an improved mounting structure for a quartz crystal plate having substantially reduced size.

Another object of this invention is to provide a mounting structure for a quartz crystal plate which substantially reduces crystal damage due to shock or vibration.

Still another object of this invention is to provide a crystal plate mounting structure which allows access to either side of the crystal plate after mounting.

Still another object of this invention is to provide a lead frame to simplify assembly and testing of a crystal unit package.

Still another object of this invention is to provide an improved method of assembly and testing of a crystal unit package.

In practicing this invention, a structure is provided for mounting a crystal plate having a plurality of electrodes on major opposite surfaces. The mounting structure includes a frame of insulating material defining a central aperture. A number of conductive mounting members extend through the frame of insulating material and have first portions extending into the central aperture. If a rectangular frame is employed, two of the first portions of the mounting members extending into the central aperture extend from opposite side walls of the frame. The crystal plate is secured to the first portions of the mounting members extending into the cavity by means of a relatively plastic solder or the like. These first portions are substantially rigid for reducing flexure of the first portions and of the crystal plate and the means for securing the crystal plate to the first portions is plastic to allow relative movements during temperature changes and the like. In addition, the first portions may be substantially equal in length and less than one-half the height of the crystal plate. This further reduces the deflection produced by the first portions when subjected to shock or vibration. Top and bottom cover members are secured to the frame for providing a sealed enclosure and may be grounded to provide an RF shield. The crystal package remains affixed to the lead frame throughout assembly and testing so that a single operation may be performed on a plurality of packages simultaneously.

THE DRAWINGS

FIG. 4 is an exploded view in perspective, similar to FIG. 3, illustrating another embodiment;

FIG. 5 is an exploded view in perspective, similar to FIG. 3, illustrating another embodiment; and FIG. 6 is a view in perspective of a plurality of lead frames affixed together, with the crystal packages in different stages of assembly.

DETAILED DESCRIPTION

Figure 1:
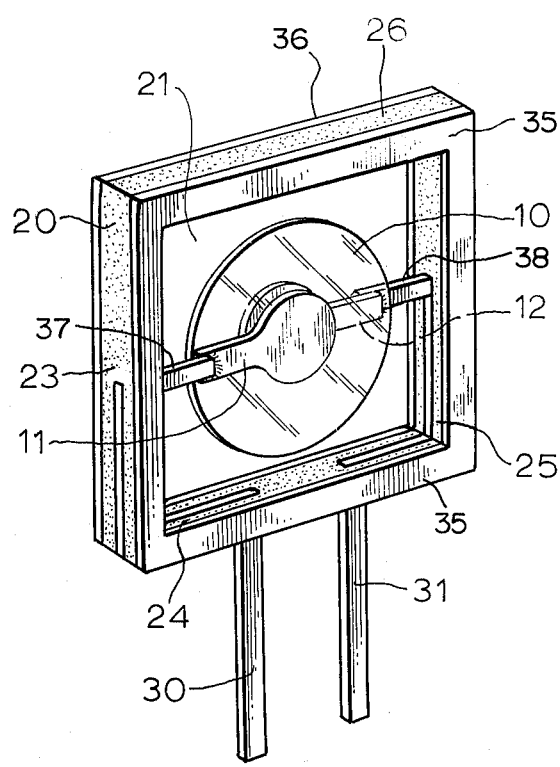
FIG. 1 is a view in perspective illustrating a two electrode single resonator quartz crystal unit mounted in one embodiment of the mounting structure of this invention.

Referring to FIG. 1, a quartz crystal plate 10 is illustrated which, in the preferred embodiment, may have a square, rectangular, or round configuration. Two electrodes, 11 and 12 are plated on opposite major surfaces of the crystal plate 10. The center portions of electrodes 11 and 12 are axially aligned on crystal plate 10 and form a single resonator. Single resonator crystal plate 10 is most often used as the quartz crystal in an oscillator.

Referring to the embodiment illustrated in FIG. 2, similar parts are designated with similar numbers because the same mounting structure is utilized except that a mounting member 32 has been removed, as will be explained in more detail later. A crystal plate 14 has two electrodes 15 and 16 plated on one major surface; and two electrodes 17 and 18 plated on the opposite major surface thereof. The center portions of electrodes 15 and 17 are axially aligned on crystal plate 14 and form one resonator of a multi-resonator crystal plate. The center portions of electrodes 16 and 18 are axially aligned on crystal plate 14 and form a second resonator on the multi-resonator crystal plate.

Figure 2:
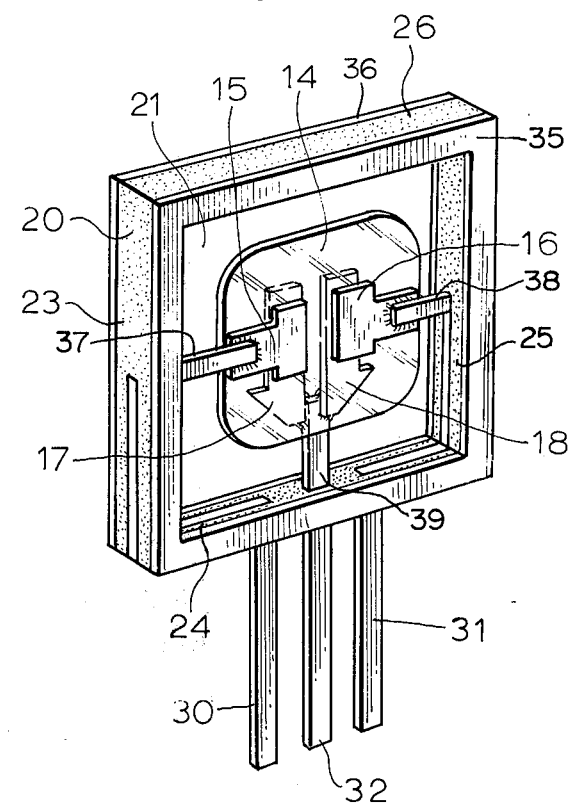
FIG. 2 is a view in perspective illustrating a four electrode two resonator crystal filter which is mounted in another embodiment of the mounting structure of this invention.
Figure 3:
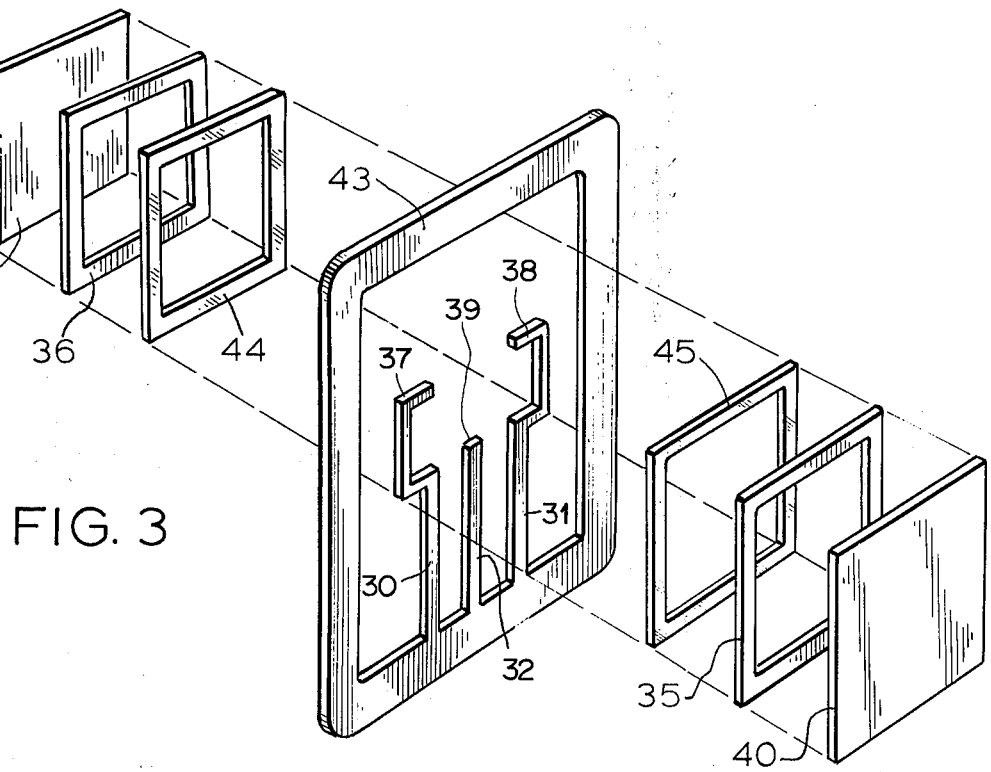
FIG. 3 is an exploded view in perspective of the mounting structure in FIG. 2 showing the lead frame and other elements as they are assembled.

Referring to FIGS. 1-3, the mounting structure in all 3 illustrations is basically the same except that a mounting member 32 has been removed in FIG. 1 since it is not required to mount the crystal plate 10. The mounting structure includes an insulating or nonconductive frame 20 which defines a central aperture 21. Nonconductive frame 20 may, for example, be a ceramic material or glass. In the preferred embodiment, borosilicate glass is used because of its expansion and contraction characteristics with temperature. Frame 20 in the embodiment shown, includes four side portions 23, 24, 25 and 26 formed into a rectangular frame.

A conductive mounting member 30 extends from a point anterior to frame 20 perpendicular to side portion 24 of frame 20 and into side portion 24. Member 30 extends longitudinally through the center of side portion 24 to side portion 23, and longitudinally through the center of side portion 23 to a point approximately equidistant between side portions 24 and 26. Member 30 then extends inwardly towards central aperture 22, with a first portion 37 extending into central aperture 21.

A conductive mounting member 31 extends from a point anterior to frame 20 perpendicular to side portion 24 of frame 20 into side portion 24. Member 31 extends longitudinally through the center of side portions 24 to side portion 25, and longitudinally through the center of side portion 25 to a point approximately equidistant between side portions 24 and 26. Member 31 then extends inwardly towards central aperture 25 with a first portion 38 extending into central aperture 21 in approximately opposed relationship to member 30.

The conductive mounting member 32 (FIG. 2) extends from a point anterior to frame 20 parallel to members 30 and 31 and transversely through the center of side portion 24 of frame 20 at a point equidistant between side portions 23 and 25. A first portion 37 of mounting member 32 extends into central aperture 21.

Mounting members 30, 31 and 32 in the preferred embodiment are made from a nickel, iron, cobalt, alloy commonly available under the trademark "Kovar". "Kovar" and borosilicate glass have the same thermal expansion coefficients so that the glass to metal seal will not be destroyed due to unequal component expansions.

Conductive metal secondary or mounting rings 35 and 36 are secured to the top 37 and bottom 38 surfaces of frame 20, respectively. In the preferred embodiment, they are also formed from "Kovar" and are attached by a high temperature bonding process described in a subsequent portion of this application.

Electrodes 11 and 12 on crystal plate 10 are secured to first portions 37 and 38, respectively, of mounting members 30 and 31 by means of a relatively plastic conducting material such as a soft solder. The plastic conducting material must mount the crystal plate 10 electrically and mechanically but must be plastic enough to allow some relative movement during temperature changes and the like, so that the crystal plate 10 is not warped or broken by different expansion rates and the like. In general the shear and tensile strengths of the plastic material must be substantially less than the force required to fracture the crystal plate 10. If soldering is employed, solder preforms may be used wherein the preforms are placed on first portions 37 and 38, and the crystal plate is placed on top of the preforms and first portions 37 and 38. The entire assembly is then heated, causing the solder preforms to reflow and adhere to electrodes 11 and 12. Through extensive experimentation it has been found that a material having a tensile strength below approximately 3,000 PSI will operate satisfactorily and preferably the material should have a tensile strength of approximately 500 PSI. Examples of soft solder which comes within these requirements are 100% Indium solder, 90% Indium—10% silver alloy solder, and solder having a high percentage of lead.

In FIG. 2, where a crystal resonator or filter is illustrated, first portions 37 and 38 of mounting members 31 and 30 are secured to electrodes 15 and 16, respectively, of crystal plate 14. First portion 39 of mounting member 32 is secured to electrodes 17 and 18. After crystal plates 10 or 14 are secured to the mounting structure, both major crystal plate sides are exposed. The crystal and mounting structure may then be placed in a testing fixture in order to test and set the frequency of the crystal plate. If the frequency is not exactly that which is desired, the electrodes on plates 10 or 14 may be adjusted slightly, by a process commonly known to those skilled in the art, until the desired operating frequency is obtained. When the desired operating frequency is obtained, conductive cover plates 40 and 41 may be secured to metal rings 35 and 36, respectively. In the preferred embodiment, cover plates 40 and 41 are also formed from "Kovar" and are rectangular metal plates which are secured to metal frames 35 and 36 by soldering. It is to be understood, however, that cover plates 40 and 41 need not be metal but may be ceramic, a metal cover plate being used because of the ease with which it can be soldered to metal frames 35 and 36 without affecting the mounted crystal plate, and also in order to maintain a constant thermal expansion coefficient among all components. However, if RF shielding is required the cover plates must be formed of metal and will be grounded as explained presently.

Because of the shortness of first portions 37, 38 and 39, these portions are substantially rigid. In this application, substantially rigid is defined to mean that the first portions 37, 38 and 39 develop a relatively small moment, or have little flexure, when placed in an environment of extreme shock or vibration.

For example, crystal plates 10 and 14 are wafers which are extremely thin and light in weight. Should crystal plate 10 or 14 be subjected to an acceleration of 5,000 G's due for example, to being dropped, the weight of crystal plate 10 or 14 upon impact would increase to approximately one ounce. First portions 37, 38 and 39 are designed such that they will remain substantially rigid and will not deflect when exposed to a weight of approximately one ounce. With a minimal deflection by first portions 37, 38 and 39, in response to a substantial shock, a minimal stress will be put on crystal plate 10 or 14. The stress that is placed on crystal plate 10 or 14 would not be sufficient to cause a fracture in the crystal plate.

By extending portions of mounting members 30 and 31 through the longitudinal centers of side portions 23 and 25 of frame 20, those portions are maintained rigid, while still allowing support of crystal plate 10 at approximately the center point in the height of the crystal. With mounting members 30, 31 and 32 coupled through side portion 24, the entire crystal mounting structure can be mounted in a circuit in substantially the same manner as most prior crystal mounting structures.

The assembly of the mounting structure is best explained by reference to FIG. 3. Mounting members 30, 31 and 32 are formed in a lead frame structure 43. Glass frame 20 consists of two portions 44 and 45. Lead frame 43 is sandwiched between front portion 45 and rear portion 44 of glass frame 20. It is sandwiched in such a way that first portions 37, 38 and 39 of mounting members 30, 31 and 32, respectively, extend into central aperture 21. Metal rings 35 and 36 are then added to the top and bottom surfaces of glass members 44 and 45. The assembly is now heated at high temperature in an oven causing the glass to flow and bond to mounting members 30, 31 and 32, and to metal rings 35 and 36. The electrodes of crystal plate 10 or 14 may then be secured to first portions 37, 38 and 39 of mounting members 30, 31 and 32, respectively, as previously described. Lead frame 43 is then detached from mounting members 30, 31 and 32 to provide separate electrical connections to each of the separate portions of the crystal plate.

The mounting structure with the crystal plate secured therein may then be tested and adjusted to the proper frequency as previously explained. Solder preforms are placed around the periphery of metal frames 35 and 36 and cover plates 40 and 41 are secured in place at the top and bottom. The entire assembly is then placed in a sealing chamber and the air is removed from the crystal assembly. The assembly is then again heated at high temperature causing the solder preforms to flow and adhere to the metal frames and cover plate. This process is conducted at a high enough temperature to cause the solder preforms to flow but at a temperature which will not cause glass frame 20 or the solder used to secure the quartz plate to melt. When the solder hardens after cooling it will cause cover plate 40 to adhere to metal ring 35 and cover plate 41 to adhere to metal ring 36.

Referring to FIG. 4, an exploded perspective view of another embodiment of the lead frame and crystal mounting structure is illustrated wherein similar numbers are utilized to designate similar parts and all numbers have an *a* added to indicate the different embodiment. Lead frame 43a has mounting members 30a, 31a and 32a formed integrally therewith, all of which are substantially similar in design to mounting members 30, 31 and 32 previously described. Portion 45a cooperates with a second similar portion to form the glass frame and metal ring 35a is affixed to the outer surface thereof to receive cover plate 40a, all as described in conjunction with the previous embodiments. In addition, a pair of inverted T shaped members 50a and 51a extend inwardly from the upper inner edge of the frame 43a toward the mounting members 30a and 31a. The T shaped members 50a and 51a extend inwardly so that the transverse or crossed portions thereof are embedded within the glass frame to aid in stabilizing the entire mounting structure within the lead frame 43a, but do not make electrical connections to any of the components. The T shaped members 50a and 51a remain attached to the lead frame 43a throughout assembly and testing to aid in the handling of the crystal package during these operations, as will be explained in more detail presently.

In the embodiment of FIG. 4, the mounting member 32a also includes a pair of generally Z shaped members 52a and 53a formed integrally therewith. The Z shaped members 52a and 53a extend outwardly from each side of the mounting member 32a at a position to lie partially within the glass frame. Each of the Z shaped members 52a and 53a extend from the glass frame into the central aperture defined by the glass frame, a short distance on either side of the first portion 39a of the mounting member 32a and extend into opposite corners of the aperture. Thus, when the mounting member 32a is embedded in the glass frame each of the Z shaped members 52a and 53a appear as an L shaped member extending from the glass frame into the centrally defined aperture and towards opposite corners. A generally L shaped member 54a is formed integral with the metal ring 35a in one corner thereof so that ends of the L shaped member 54a are in contact with adjacent sides of the metal ring 35a. During assembly, the outwardly protruding ends of the Z shaped members 52a and 53a are bent so that the member 52a is in contact with the L shaped member 54a when the metal ring 35a is properly placed on the glass frame. In a similar manner the outwardly protruding end of the Z shaped member 53a will be in contact with a similar L shaped member in the opposite metal ring (not shown). After the entire structure is bonded by the heating of the glass portions, the Z shaped members and L shaped members can be electrically affixed together by solder, spot welding, or the like so that the metal rings 35a and 36a are in electrical contact with the mounting member 32a. When the cover plates 40a and 41a are affixed to the metal rings 35a and 36a the cover plates form RF shields for the entire structure.

FIG. 5 is an exploded view in perspective of another embodiment wherein similar parts are designated with similar numbers and all numbers have a *b* added thereto to indicate that it is another embodiment. All of the parts of the embodiment of FIG. 5 are similar to those described in FIG. 4, except that the Z shaped members 52a and 53a and the L shaped members affixed to the metal rings are not included. Instead, a different system for electrically connecting the cover plates 40b (not shown) and 41b is disclosed. In this embodiment an L shaped member 55b is integrally formed with the mounting member 32b and extends outwardly therefrom so that one arm lies within the glass frame and the other arm extends from the glass frame into the central aperture defined thereby, generally parallel with and spaced from the first portion 39b of the mounting member 32b. A small protrusion 56b is formed at one inner edge of each of the metal rings 36b and 35b (not shown) so that when the mounting frame is assembled the protrusions 56b form a channel with the outwardly extended end of the L shaped member 55b therebetween. A very good electrical connection can then be made between the metal frames 36b, 35b and the mounting member 32b by simply dropping a small amount of solder or conducting epoxy in the channel. It should be understood that other methods and means might be utilized to electrically connect the metal rings on either side of the mounting frame, which means might include plating a thin conducting layer on the glass frame between the two metal rings and the first portion 39b of the mounting member 32b or any integral portion thereof, such as the L shaped member 55b.

Referring to FIG. 6 wherein similar parts are designated with similar numbers, a plurality of integrally formed lead frames are illustrated with mounting frames illustrated in different stages of assembly. One, two and three primes have been added to the numbers of the different lead frames to differentiate them. It will be noted that through the use of the plurality of integral lead frames a single operation in the assembly of the mounting frames and the crystal unit package can be performed on a plurality of mounting frames simultaneously. Thus, the labor and time required in the assembly can be greatly reduced. In addition, referring to lead frame 43''', it can be seen that the crystal unit package is maintained in fixed position by the T shaped members 50''' and 51''' even though the mounting members 30''', 31''' and 32''' have been severed. Thus, testing operations can be performed on the crystal unit and the package is held rigidly in position by the lead frame 43'''. This greatly simplifies handling and testing procedures.

Thus, an improved mounting structure for a quartz or other type crystal unit has been provided having substantially reduced size. This mounting structure substantially reduces the crystal plate damage due to shock or vibration and is designed so as to allow access to either side of the crystal plate after mounting for frequency correction. Further, novel means are incorporated for electrically connecting the metal cover plates to form RF shields. Also, novel means are included in the lead frame to maintain the mounting structure mechanically connected to the lead frame for later assembly operations and testing.

While we have shown and described specific embodiments of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. A crystal plate mounting structure for mounting a crystal plate having a plurality of electrodes on major surfaces thereof including in combination:
   a frame of insulating material defining a central aperture;
   a plurality of conductive mounting members each extending through said insulating material and having first portions extending into said aperture;
   two of said first portions of said plurality of mounting members extending into said central aperture from substantially opposite directions;
   plastic material, having shear and tensile strengths substantially less than the force required to fracture the crystal plate, electrically and mechanically securing said crystal electrodes to said first portions of said mounting members;
   said first portions of said mounting members being substantially rigid for reducing flexure of said portions and said crystal plate; and
   top and bottom cover members secured to said frame for providing a sealed enclosure.

2. The crystal plate mounting structure of claim 1 wherein each of said first portions of said mounting structure extending into said cavity are substantially the same length.

3. The crystal plate mounting structure of claim 2 wherein said crystal plate has a particular height, and said first portions of said mounting members extending into said aperture are short as compared to one-half the height of said crystal plate.

4. The crystal plate mounting structure of claim 1 wherein said top and bottom members are metal and said conductive mounting members are metal.

5. A crystal plate mounting structure as claimed in claim 4 wherein one of the mounting members is common and including means electrically connecting the metal cover members thereto.

6. The crystal plate mounting structure of claim 4 wherein said frame is glass.

7. A crystal plate mounting structure as claimed in claim 6 wherein the glass is borosilicate and the metal is a nickel, iron, cobalt, alloy having approximately the same thermal expansion coefficient as said glass.

8. The crystal plate mounting structure of claim 6 further including secondary top and bottom frames secured to said glass frame, said top and bottom cover members being secured to said secondary top and bottom frames respectively for providing said sealed enclosure.

9. A crystal plate mounting structure as claimed in claim 8 wherein the secondary frames each further includes a protrusion thereon, in the same plane, which protrusions cooperate to form a channel including a portion of a common mounting member therein, and a conducting material contained in said channel for electrically connecting said secondary frames and said common mounting member.

10. The crystal plate mounting structure of claim 8 wherein said frame is formed in a ring and said top and bottom members are discs.

11. The crystal plate mounting structure of claim 8 wherein said frame is formed in a rectangle and said top and bottom members are rectangular plates.

12. The crystal plate mounting structure of claim 11 wherein said frame includes four side portions forming said rectangle, said mounting members extending longitudinally through a plurality of said side portions and into said aperture from opposite side portions with all anterior portions of said mounting members extending from a single side.

13. A crystal plate mounting structure as claimed in claim 1 wherein the plastic material has a tensile strength below approximately 3,000 PSI.

14. A crystal plate mounting structure as claimed in claim 13 wherein the plastic material includes Indium.

15. A crystal plate mounting structure for mounting a crystal plate having a plurality of electrodes on major surfaces thereof including in combination:
   a frame of insulating material defining a central aperture;
   a plurality of conductive mounting members each extending through said insulating material and having first portions extending into said aperture;
   plastic material, having shear and tensile strengths substantially less than the force required to fracture the crystal plate, electrically and mechanically securing said crystal electrodes to said first portions of said mounting members;
   said first portions of said mounting members being substantially rigid for reducing flexure of said portions and said crystal plate; and
   top and bottom cover members secured to said frame for providing a sealed enclosure.

* * * * *